(12) United States Patent
Slutskiy et al.

(10) Patent No.: US 6,384,514 B1
(45) Date of Patent: May 7, 2002

(54) REVERSIBLE PIEZOELECTRIC POSITIONING DEVICE AND A DISK DRIVE USING SAME

(75) Inventors: Imanuil A. Slutskiy; Alexandr I. Slutcky, both of Far Rockaway, NY (US)

(73) Assignee: Technology Commercialization Corp., New York, NY (US)

( * ) Notice: Subject to any disclaimer, the term of this patent is extended or adjusted under 35 U.S.C. 154(b) by 45 days.

(21) Appl. No.: 09/612,580

(22) Filed: Jul. 7, 2000

Related U.S. Application Data

(63) Continuation-in-part of application No. 09/542,062, filed on Apr. 3, 2000, now Pat. No. 6,242,850, which is a continuation-in-part of application No. 09/362,139, filed on Jul. 28, 1999, now Pat. No. 6,068,256.

(51) Int. Cl.$^7$ ............................................... H01L 41/08
(52) U.S. Cl. ................... 310/323.17; 310/328; 271/264
(58) Field of Search ........................... 310/323.17, 328, 310/323.02; 271/264

(56) References Cited

U.S. PATENT DOCUMENTS

| | | | | |
|---|---|---|---|---|
| 4,188,645 A | | 2/1980 | Ragle | 360/75 |
| 4,764,828 A | | 8/1988 | Gollbach | 360/98 |
| 5,189,578 A | | 2/1993 | Mori | 360/106 |
| 5,382,863 A | * | 1/1995 | Tyren | 310/26 |
| 5,400,192 A | | 3/1995 | Mizoshita | 360/77.16 |
| 5,438,469 A | | 8/1995 | Rudi | 360/109 |
| 5,453,653 A | | 9/1995 | Zumeris | 310/323 |
| 5,521,778 A | | 5/1996 | Boutaghou | 360/106 |
| 5,616,980 A | | 4/1997 | Zumeris | 310/323 |
| 5,682,076 A | | 10/1997 | Zumeris | 310/323 |
| 5,696,421 A | | 12/1997 | Zumeris | 310/328 |
| 5,714,833 A | | 2/1998 | Zumeris | 310/328 |
| 5,777,423 A | | 7/1998 | Zumeris | 310/323 |

FOREIGN PATENT DOCUMENTS

| | | | | |
|---|---|---|---|---|
| EP | 0633616 A2 | 11/1995 | | H01L/41/09 |
| WO | WO 92/10874 | 6/1992 | | H02N/2/00 |

* cited by examiner

*Primary Examiner*—Brian Sircus
*Assistant Examiner*—Michael C. Zarroli
(74) *Attorney, Agent, or Firm*—Boris Leschinsky

(57) ABSTRACT

A reversible positioning device contains a piezoelectric actuator of a linear contact type urged against a rotary or a linear type movable element. The actuator is equipped with two sets of electrodes. The control unit supplies electrical impulses to either one of these sets of electrodes to initiate periodic oscillations of the actuator causing elastic compressions of the movable element and subsequent movements in either one of the opposite directions. One particularly useful application is in the movable arm of the disk drive data storage system such as a CD-ROM or alike. Extreme accuracy of positioning of a readout head and a low inertia allow for fast response time approaching 2 msec. a novel control method is in supplying a higher voltage from a control unit for the longer forward motion of the positioning device followed by a shorter back movement due to lower voltage. That control method increases the positioning accuracy even further to as low as 0.2 microns.

32 Claims, 5 Drawing Sheets

REVERSIBLE PIEZOELECTRIC POSITIONING DEVICE AND A DISK DRIVE USING SAME

CROSS-REFERENCE DATA

This is a continuation-in-part of our U.S. Pat. application Ser. No. 09/542,062 filed Apr. 3, 2000 now U.S. Pat. No. 6,242,850 which in turn is a continuation-in-part of our U.S. patent application Ser. No. 09/362,139 filed Jul. 28, 1999, now U.S. Pat. No. 6,068,256 both of which are incorporated herein by reference in their entirety.

BACKGROUND OF THE INVENTION

1. Field of the Invention

The present invention relates generally to piezoelectric positioning devices and in particular to piezoelectric positioning devices with reversible action of both rotational and linear reciprocal types. More specifically, the positioning device of the invention contains one or more actuators having a linear contact with the corresponding rotor or the slider. The positioning device of the invention can be used generally as a high performance replacement for small conventional electric drivers used in computer equipment, robotics, manufacturing equipment, aerospace, automobiles, toys, etc. The positioning device of the present invention can be used particularly effectively in various turntable and disk drive devices such as for magnetic and optical data storage equipment, especially when small size and weight are required for compactness and when precision positioning of a magnetic or optical reading head is needed for accurate and reliable performance.

2. Description of the Prior Art

Linear and rotational piezoelectric positioning devices with reversible action are generally well known and widely used in various applications. All of these known devices incorporate a basic piezoelectric drive arrangement in which a piezoelectric actuator is placed in contact with a movable element such as a slider or a rotor made typically of a hard to compress material. A frictional contact surface is therefore intermittently present between the actuator and that movable element which transmits the driving force or torque from the piezoelectric actuator to the movable element. Limitations of such arrangement are described in detail in the parent patent applications. Briefly, these devices have limited number of operating hours due to the wear and ultimately mechanical failure of the surface of the movable element. Once the surface is damaged, the contact between the actuator and the movable element is no longer optimal and the driving force transmission is no longer present. One negative consequence of that is reduced accuracy of positioning as well as reduced operational life. Another limitation of these devices is in the relatively high clamping force between the actuator and the movable element in an attempt to partially compensate for the wear of the surface contact. That high clamping force reduces the efficiency of the force transmission and overall efficiency of the device.

We have proposed and described in details in our previous applications the piezoelectric drive device with linear contact between the actuator and the movable element. Briefly stated, the actuator equipped with a hard surface insert engages with the compressible surface of the movable element to compress it within the elastic limits thereof without any slippage and to form a temporary microgroove on that surface. Upon disengagement, the surface of the movable element restores its initial shape until the next compression cycle. These devices demonstrate higher energy transmission efficiency and longer operating life. However, reversible devices with such linear contact, both linear and rotational were not known before in the prior art.

One particularly advantageous application of a reversible device of this type is for data storage devices. Those skilled in the art of making and using data processing and storage equipment are familiar with magnetic data storage arrangements when a transducer is positioned adjacent a moving magnetic recording surface. Such a device will record magnetic bits as data from the disk surface and recover this information by processing the signal from a transducer adjacent a particular "recording track" along the surface.

This invention relates in part to a piezoelectric positioning device for establishing and maintaining the placement of such a transducer with respect to such recording tracks; it is particularly adapted for recording on magnetic tape, drum, and disk media, especially for high density, high TPI recording as well as for recording on various optical disks and other optical devices. In such recording, a fast, non-magnetic, miniaturized, solid state translation means is particularly desired—especially where translation distances are relatively small, on the order of a few dozen micro inches or more, typically over a total excursion of only a few mils.

Limitations in present-day transducer positioning apparatus, such as the typical voice coil actuator systems, or the like are well known. In addition to their mechanical inefficiency due to a large number of moving parts, such systems are undesirably large, slow and inflexible in their design approach. They are particularly unsatisfactory for "centering" a transducer relative to a narrow recording track, where positioning is critical. Such systems are also troublesome in that they use solenoid magnets or other magnetic actuator means, creating stray magnetic fields that can interfere with the magnetic recording apparatus. The present invention is adapted to improve these shortcomings with a solid state, piezo-electric flexure arrangement for mounting and positioning magnetic heads.

Various reversible piezoelectric positioning devices were proposed in the prior art for use in this disk drive application. Examples of such devices can be found in U.S. Pat. Nos. 4,188,645 by Ragle; 4,764,828 by Gollbach; 5,189,578 by Mori; 5,400,192 by Mizoshita; 5,438,469 by Rudi; 5,521,778 by Boutaghou and others. As was indicated above, all of these devices suffer from the limitations arising from the surface contact between the piezoelectric actuator and the movable element, a rotor or a swinging arm in this case. A smaller and more efficient positioning device with extended operational life is therefore needed for these disk drives.

Various reversible piezoelectric devices were proposed by Zumeris of Nanomotion and described in the following U.S. Patents which are incorporated herein by reference: Nos. 5,616,980; 5,682,076; 5,696,421; 5,714,833; and 5,777,423. The design of a piezoelectric plate is of particular interest for this invention. Generally speaking, the piezoelectric plate is described as having a rectangular shape. Four electrodes are plated or otherwise attached to the top face of the plate in a checkerboard alternating arrangement. A larger single electrode is placed on the opposite bottom face of the plate. By exciting the top and the bottom electrodes in alternate sequence, one can achieve certain vibrations of the plate in either one of the opposite directions. These vibrations can then be used to reversibly drive a movable element. Although the design of the piezoelectric plate has certain advantages such as simplicity of operation, these devices have similar limitations to those of the other patents of the prior art. The most important limitation is limited operational life and low efficiency of energy transmission due to the wear and eventual slippage of the contact surface of the movable element made of a hard to compress material. That leads to reduced accuracy and lower efficiency of operation. Piezoelectric reversible positioning device is therefore needed to overcome these limitations.

SUMMARY OF THE INVENTION

Accordingly, it is an object of the present invention to overcome these and other drawbacks of the prior art by providing a novel reversible piezoelectric positioning device of both rotational and linear type with linear contact between the actuator and the movable element with improved operational life.

Another object of the invention is to provide a reversible piezoelectric positioning device for moving the arm containing a reading head of a disk drive for data storage devices such as optical, CD-ROM, hard drive, floppy drive, and other similar magnetic and optical disks and tapes; such positioning device being more accurate in positioning, smaller in size, lower in weight, and requiring less energy for its operation.

Yet another object of the present invention is to provide a reversible piezoelectric positioning device with superior start-stop characteristics and reduced response time, preferably such response time being less than 2 msec.

A further object of the invention is to provide a reversible piezoelectric positioning device with improved positioning accuracy and resolution.

A further yet object of the invention is to provide a reversible piezoelectric positioning device with one or more actuators.

A further yet object of the invention is to provide a reversible piezoelectric positioning device with an actuator adapted to compresses the surface of the movable element within elastic limits thereof, in which case the surface of the movable element fully restores its initial shape after the compression from the actuator is removed.

A final object of the present invention is to provide a control method for a reversible piezoelectric positioning device with improved positioning resolution and accuracy by supplying alternate electrodes of the piezoelectric plate with electrical signal of different voltage.

According to the invention, the reversible positioning device contains generally a piezoelectric plate equipped with a set of electrodes. The plate is capable of generating vibrations once voltage is supplied from the control unit through respective electrodes. These vibrations generate the plate flexing motion which can be directed in either one of two opposite directions depending on which electrodes are activated. The plate is equipped also with a hard edge insert of a linear type which is urged against a movable element. The plate with the hard edge insert is preferably positioned perpendicularly against the movable element. Once appropriate electrical voltage is supplied to either one of the alternate electrodes, the flexing motion of the piezoelectric plate is transferred through the hard edge insert onto the movable element through elastic compression thereof. The movable element then moves a predetermined distance of a single step in a predetermined direction after which the hard edge insert is disengaged from the compressible surface of the movable element and the device is ready for the next movement cycle. Reverse direction of movement can be achieved by switching the polarity of the electrical signal and activating the other set of electrodes.

More specifically, the interaction between the piezoelectric actuator and the movable element is based on a contact between a hard edge insert of the actuator having a Young's modulus $E_a$ in the range of between $1 \times 10^7$ N/cm$^2$ and $10 \times 10^7$ N/cm$^2$ and preferably about $5 \times 10^7$ N/cm$^2$ and a generally softer and more elastic surface of the movable element having a Young's modulus $E_e$ in the range of between about $0.5 \times 10^6$ N/cm$^2$ and about $5 \times 10^6$ N/cm$^2$ and preferably about $2 \times 10^6$ N/cm$^2$. Such difference between the hardness of the hard edge insert of the actuator and the surface of the movable element leads to a particularly advantageous interaction between these two parts of the device. Engagement of the hard edge insert with the surface of the movable element leads to an elastic compression of that surface to a certain predetermined depth forming a microgroove during the time when both parts move together. Subsequent contraction of the actuator disengages both parts and the elastic surface of the movable element restores its initial shape. During the elongation/contraction cycle, the hard edge insert of the actuator undertakes a complex geometrical motion, trajectory of which is a result of both the frictional and elastic compression interaction between the actuator and the movable element. Should the phase shift between the longitudinal and the bending oscillations of the actuator be about $\pi/2$, this trajectory becomes continuous and close to the shape of an oval. In addition to the friction and elastic deformation of the movable element by the actuator, a wedging effect occurs when the contact angle is about 45 degrees which can be utilized to further increase the driving force by about additional 30 to 40%.

In accordance with the present invention, extended operational life of the device can be achieved by ensuring the depth of compressions of the movable element not exceeding its elastic limit. In that case, every compression of the movable element by the actuator is purely elastic and no permanent deformation occurs which may lead to premature wear and surface damage. Elastic materials for the movable element and the main parameters of the actuator are chosen in such a way that the relative deformation $\epsilon$ along the line of contact of the movable element surface does not exceed about 0.001.

Another benefit of the wedging of the actuator into the relatively softer surface of the movable element is that there is less slippage between the contact surfaces of the two components than when there is only frictional contact. Slippage between the contact surfaces increases when a load is placed against the movable element and when the device is initially turned on, until it reaches its resonant frequency. Higher slippage rates are associated with declining efficiency and positioning accuracy. It is not uncommon in the art to employ a sensor on the movable element to relay positioning information to the control unit for purposes of eliminating the positioning inaccuracies caused by slippage between the contact surfaces.

Increased driving force may be also achieved by employing two or more actuators. In that case, multiple piezoelectric actuators are interacting with a single movable element preferably all at the same time allowing for increase of the device loading force without changing the dimensions and weight.

Since the hard edge insert formes a linear microgroove when engaged with the surface of the movable element, the slippage of the insert relative to the movable element is largely avoided so the accuracy of positioning is maintained throughout the operational life of the device. Also, the clamping force may be substantially reduced in this case which allows for general reduction of the sizes and weight of all involved elements without sacrificing in performance. In turn, reduced weight allows for faster response time of less than 2 msec since inertia of all movable elements is substantially reduced.

A further improvement is a novel control method for a device of this type. To improve the resolution of the reversible positioning device, one can apply different voltages to both "forward" and "back" steps and alternate them at the same time. The result is such that the movable element will first move in say "forward" direction to the distance determined by the "forward" voltage and then right after that move "back" to a distance determined by a lower "back" voltage. The resultant distance of travel can therefore be finely determined by a difference between the "forward" and the "back" distances which in turn are determined by the "forward" and "back" voltages. This control method of one step "forward" and smaller step "back" allows to achieve extremely high positioning accuracy and resolution of as low as 0.2 micron while taking all advantages of the low weight and inertia of the positioning device of the present invention.

BRIEF DESCRIPTION OF THE DRAWINGS

A more complete appreciation of the subject matter of the present invention and its various advantages can be realized by reference to the following detailed description in which reference is made to the accompanying drawings in which.

DETAILED DESCRIPTION OF THE INVENTION

Figure 1:
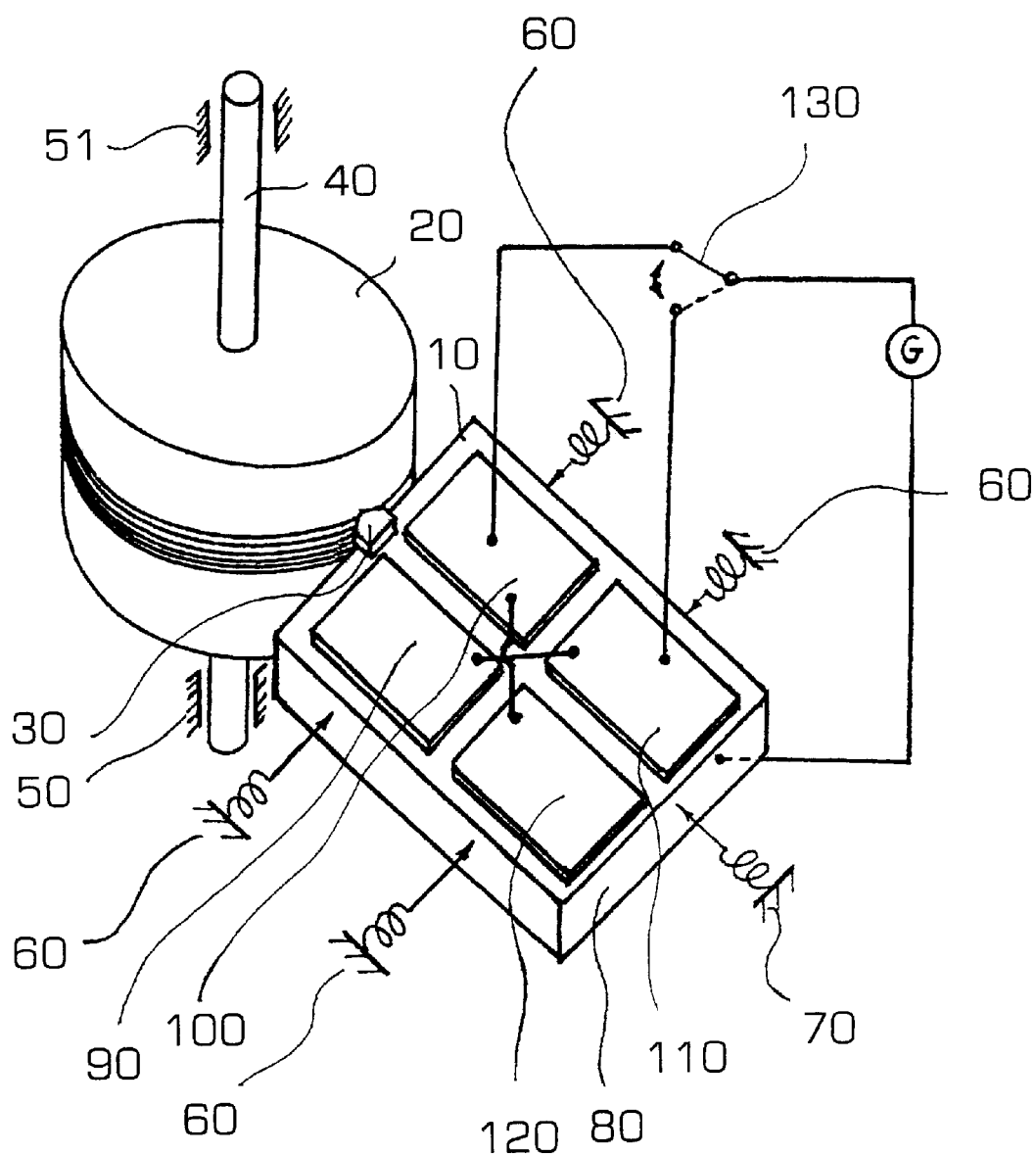
FIG. 1 is a highly schematic view of a rotational reversible piezoelectric positioning device of the present invention.

A detailed description of the present invention follows with reference to the accompanying drawings in which like elements are indicated by like reference numerals.

FIG. 1 illustrates a highly schematic view of the rotational reversible piezoelectric positioning device of the present invention. It contains a piezoelectric actuator (10) with a hard edge insert (30) at its working end urged against the rotor (20) having a shaft (40) rotatably suspended in the housing (50) by any known means such as for example a set of bearings (51). The actuator (10) is preferably positioned perpendicularly to the surface of the rotor (20). The actuator (10) in turn may itself be suspended by springs (60) from the sides and by a spring (70) from the end opposite its working end. The design of the actuator (10) may be any known design of piezoelectric reversible actuator. An example shown on FIG. 1 contains a piezoelectric plate of rectangular shape having a short side and a long side similar to the design described by Zumeris. Appropriate electrodes are placed on the top face and the bottom face of the plate. The top face contains four electrode sectors (90), (100), (110), and (120) organized in an alternate checkerboard arrangement. Diagonally positioned electrodes (90) and (110), as well as (100) and (120) are connected to each other respectively. The bottom face of the actuator (10) contains a single electrode (80) occupying the entire surface of the plate.

The bottom electrode (80) is connected to the first contact of a generator of electrical impulses G, while the second contact is connected to the switch (130) designed to alternate the activation signal between the pairs of electrodes (90)/(110) and (100)/(120). Depending on the position of the switch (130), the actuator will drive the rotor "forward" or "back".

The hard edge insert (30) is made of a hard to compress and wear resistant material such a ceramic or corund having a Young's modulus $E_a$ in the range of between $1 \times 10^7$ N/cm$^2$ and $10 \times 10^7$ N/cm$^2$ and preferably about $5 \times 10^7$ N/cm$^2$. The rotor (20), on the other hand, at least in the section interacting with the hard edge insert (30), is made of a generally softer and more elastic material with an appropriate natural elastic compression limit characterized by the surface having a Young's modulus $E_e$ in the range of between about $0.5 \times 10^6$ N/cm$^2$ and about $5 \times 10^6$ N/cm$^2$ and preferably about $2 \times 10^6$ N/cm$^2$. A laminated design is one way to achieve the right level of Young's modulus such as a layer of copper alternated with layers of paper, textile, or polymer as was described by us in earlier patent applications.

Upon activation of the generator G and depending on the position of the switch (130), the electrical impulse of a certain voltage causes one set of diagonal electrodes to bend the actuator in a predetermined direction, say "forward" for example. It is advantageous to maintain the frequency of these impulses to be close to the natural longitudinal resonance frequency of the piezoelectric plate. Upon elongation of the actuator (10) caused by the electrical impulse, the hard edge insert (30) engages with the surface of the rotor (20) forcing it to move to a predetermined distance or in this case a predetermined angle of rotation. The angle of rotation in turn depends on the voltage of the electrical impulse from the generator G. Elongation of the actuator (10) leads to compression of the surface of the rotor (20) to a predetermined depth not exceeding the elastic limit of the rotor material so that the relative deformation $\epsilon$ along the line of contact of the rotor (20) does not exceed about 0.001. Deactivation of electrodes disengages the actuator (10) from the rotor (20) and returns it to the initial position. Changing the position of the switch (130) causes the activation of the opposite set of electrodes and subsequently the reverse motion of the rotor (20).

Accuracy and positional resolution of the device will be determined by a certain minimum voltage that is required to predictably move the actuator considering the load force on a rotor (20). There is, however, a way to further increase the positional accuracy of any reversible piezoelectric positioning device including that of the present invention by employing a novel control method. The essence of the method is in obtaining a higher yet positional accuracy by causing an intentional overrun of the rotor during the first step and then causing it to move back somewhat during the next step. In other words, the first step of the actuator is caused by a generator impulse of a certain voltage level V1 which will move the rotor "forward" to a certain distance or angle. Once there, the next step is "back" with the voltage V2 which is smaller than the "forward" voltage V1. That causes the rotor to return back somewhat but not as much as with the initial forward motion. This control method of having a larger step forward followed by a smaller step back allows for an extremely high positioning accuracy approaching 0.2 micron. The design of the positioning device of the present invention allows to utilize all the advantages of this method because of its low inertia which was described above.

Figure 2:
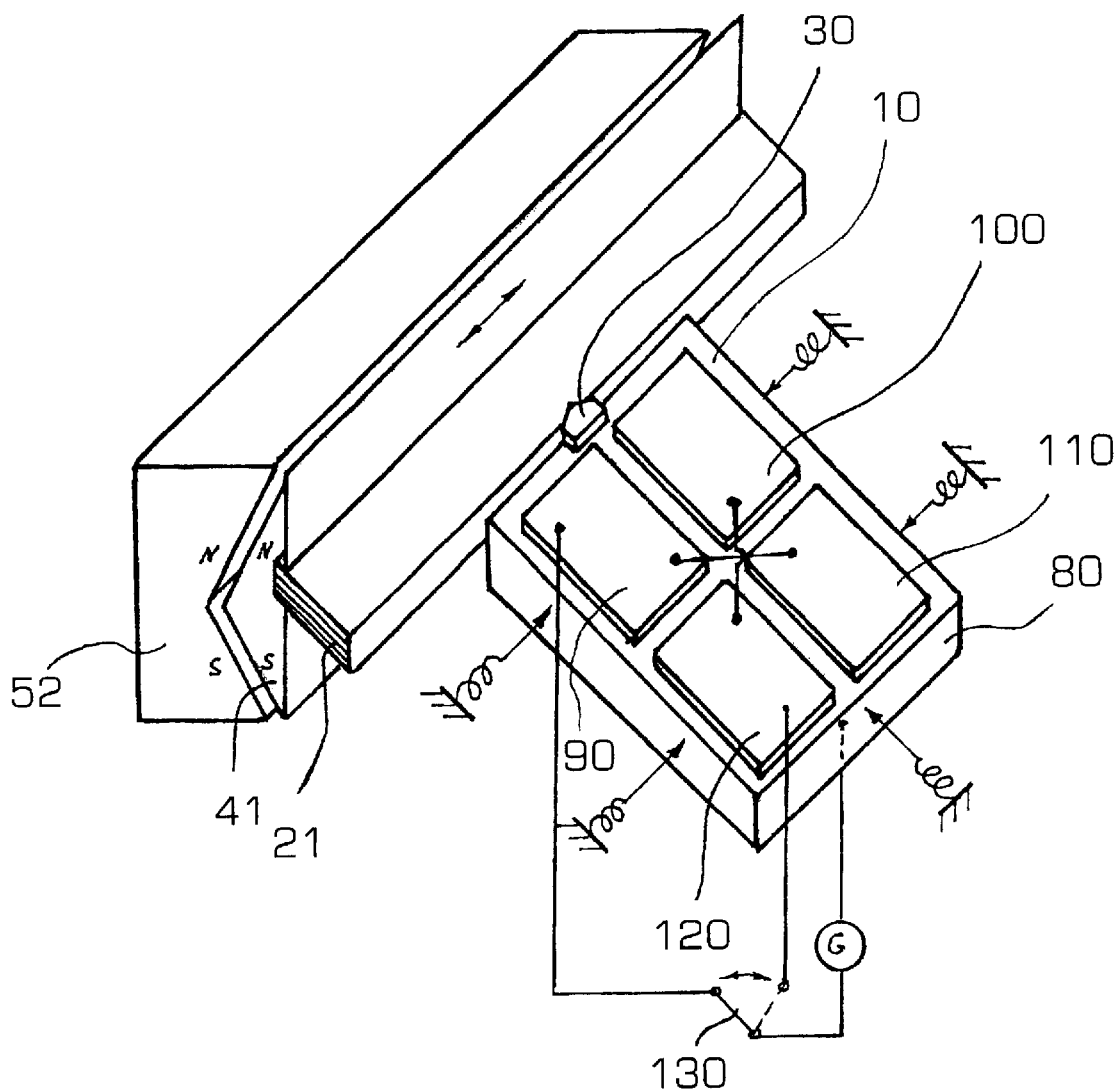
FIG. 2 is a highly schematic view of a linear reciprocal piezoelectric positioning device of the present invention.

FIG. 2 illustrates a linear reciprocal version of the reversible piezoelectric positioning device of the present invention. A slider (41) is movably placed in the housing (52) using any known sliding arrangement such as for example the use of magnetic holders as shown on the drawing. Other similar arrangements may also be used. The slider (41) is equipped with an insert (21) having the same elastic surface, natural elastic compression limit, and the Young's modulus as the rotor (40) shown on FIG. 1. Laminated design of the insert (21) may help achieve correct surface hardness. The piezoelectric actuator (10) and the control unit are of the same basic design as shown on FIG. 1 so that the hard edge insert (30) is placed normally to and urged against the surface of the insert (21) of the slider (41). Upon activation of the control unit, the electrical impulses from the generator G will cause vibrations of the actuator (10) which in turn will drive the slider (41) in a direction determined by a position of the switch (130). The method of increased positional accuracy described above can also be used successfully in this linear version of the device.

As was explained above, one particularly advantageous application of the positioning device of the present invention is in turning the arm of a disk drive. Such arm typically contains an optical or a magnetic readout head designed to obtain data information from the disk rotating in its vicinity. Precise positioning of the arm is critical for its performance while the driving device should be small and have low weight to improve the portability of the overall apparatus.

Figure 3:
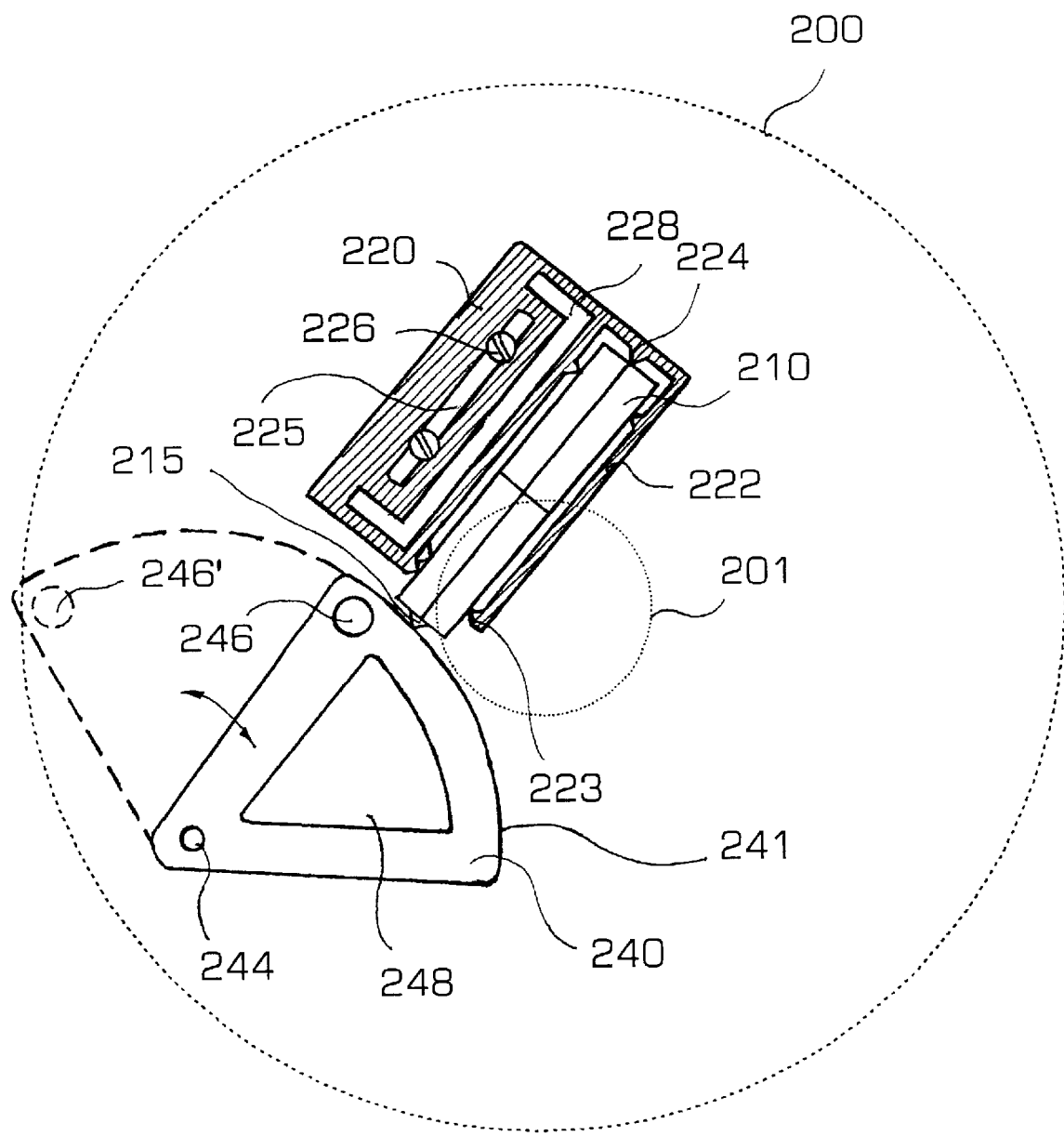
FIG. 3 is a highly schematic top view of a rotational reversible piezoelectric positioning device of the present invention used to drive the reading arm of a disk drive.
Figure 4:
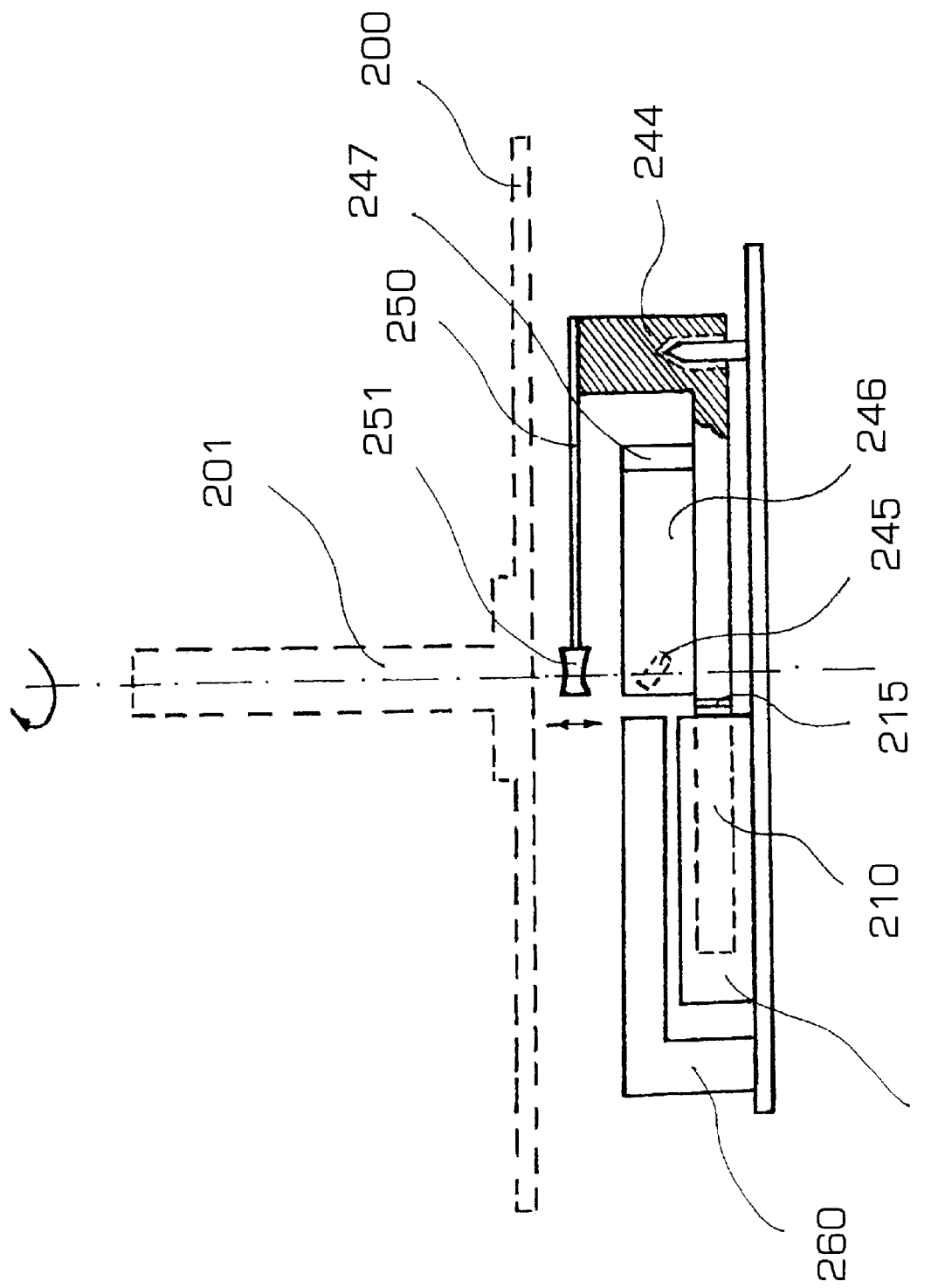
FIG. 4 is a highly schematic side view of the device shown on FIG. 3.

FIGS. 3 and 4 illustrate a version of such a device utilizing the positioning device of the present invention. The basics of the design is similar to that shown on FIG. 1. For clarity of illustration, some of the elements of the design are shown on either FIG. 3 or FIG. 4 only and omitted on the other Figure.

FIG. 3 shows the top view of the device for readout of the information off the disk which general outline is shown as line (200). The disk is placed on the shaft (201) which can be driven by a conventional electrical motor or a piezoelectric motor of the design proposed by us in the co-pending U.S. patent application Ser. No. 09/542,062 filed Apr. 3, 2000. The readout head (246) is located on a sector-like arm (240) which in turn is positioned adjacent the disk (200) and can turn around the axis (244). For the purposes of this application, the words "read-out head" also incorporate recording heads and other similar devices. The arcuate surface (241) of the arm (240) is made of material similar to the rotor (20) of FIG. 1 and has appropriate Young's modulus. It may optionally have a laminated design. The use of polymer based laminated materials for the sector arm design instead of ceramics allows to reduce its weight significantly. The importance of weight is clear since it determines the inertia and therefore the reaction time of the device. To further reduce weight, it is advisable to make a cutout (248) which can be of any appropriate shape. Our calculations show that this design may weight significantly less than other comparable devices and that in turn allows to reduce the response time down to as little as 2 msec.

The piezoelectric reversible actuator (210) is suspended with appropriate force in the spring-like arms (222) of the clamp (220) by four side raised contact points (223) and one axial raised contact point (224). The clamp (220) in turn is attached to the overall housing of the device (not shown) via two screws (226) and a slot (225). This design and the orientation of the slot (225) allow the position of the actuator (210) to be adjusted to be either closer or further away from the surface (241) of the sector-like arm (240). The design of the clamp (220) also contains the slot (228) designed to mechanically isolate the actuator (210) from the rest of the clamp (220) and hence the housing of the device. The actuator (210) is equipped with a hard edge insert (215) and a set of electrodes (not shown) similar in design to the previously described.

FIG. 4 shows a side view of the same design. In addition to the previously shown components, one can see a control unit (260) removed on FIG. 3. Also, the readout head (246) is shown with the focusing lens (251) placed on the end of a cantilever holder (250), which was not shown on FIG. 3 for clarity of illustration. The holder (250) is made using a bimorph design which advantageously allows for easy reciprocal movement of the lens (251) closer and further away from the surface of the disk (200). As an example of such a bimorph design, the device produced by Piezo-Systems Inc., part No. T220-H4-203 (1.250"L×0.25"W×0.02"H) may be successfully used for this purpose.

In operation, energizing the piezoelectric actuator (210) by a control unit (260) of a design similar to the previously described allows (depending on the position of the alternating switch) movement of the sector-like arm (240) in either one of the radial directions so that the readout head (246) can be placed in any desirable position (246') with great accuracy. For even higher positioning accuracy, the control method of a longer step forward followed by a shorter step back (see above for detailed discussion) can be used in this device as well.

Figure 5:
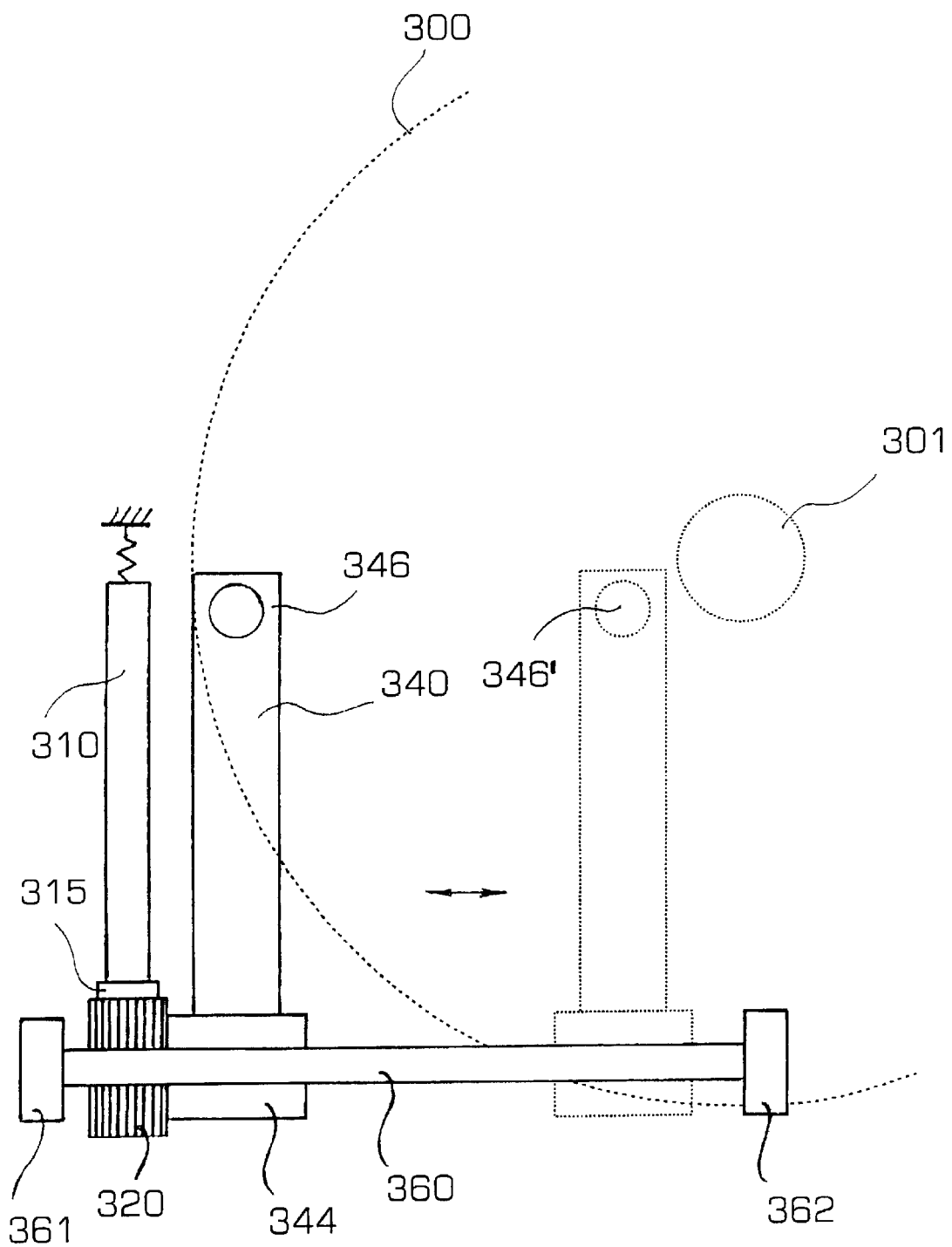
FIG. 5 is a highly schematic view of a rotational reversible piezoelectric positioning device of the present invention coupled with the screw drive for positioning of an optical readout head of a disk drive.

Finally, FIG. 5 shows yet another variation of the use of the reversible piezoelectric positioning device of the present invention for the purpose of positioning the readout head of a disk drive. In this more traditional arrangement of a positioning mechanism, the reversible piezoelectric actuator is used for driving the worm screw gear which in turn moves the readout head assembly back and forth along the shaft of the gear. In detail, the disk (300) is placed on a shaft (301) and made to rotate by any known and commonly used means. The readout head (346) is positioned on the arm (340) which in turn can move along the worm-screw shaft (360) having a screw-type thread along at least a portion of its length by means of a mating gear (344). The shaft (360) contains a wheel (320) with an optional laminate design and having a surface made from the material with appropriate Young's modulus described in detail above. The shaft (360) is also rotatably positioned in bearings (361) and (362) so that rotation of the wheel (320) causes rotation of the shaft (360). The piezoelectric actuator (310) shown from the side, has similar design to the previously described. It is capable of transmitting torque through its hard edge insert (315) onto the surface of the wheel (320) and turn it in the direction determined by the position of the alternating switch of the control unit (not shown).

In operation, activation of the piezoelectric actuator (310) leads to turning of the wheel (320) which in turn rotates the shaft (360) in the predetermined direction. That forces the movement of the arm (340) with the readout head (346) in the necessary direction and allows for extreme accuracy of positioning the head (346) in the new position (346'). High accuracy of this device is a result of combining the inherent accuracies of the piezoelectric actuator and the worm screw gear transmission. a bimorph focusing device can be also used in this arrangement as was described above. If further increase of positioning accuracy is desired, the novel control method discussed previously can also be used.

Although the present invention is described for a specific version of a piezoelectric positioning device, it is not limited thereto. One example of an alternate design includes a hollow rotor and an actuator with the hard edge insert positioned against the inside surface of the rotor for transmitting the rotational torque from the inside rather then from the outside of the rotor as has been mostly described above. Another alternate design would contain multiple reversible piezoelectric actuators working in parallel to move a single movable element. Numerous other variations and modifications would be readily appreciated by those skilled in the art and are intended to be included in the scope of the invention, which is restricted only by the following claims.

We claim:

1. A reversible piezoelectric positioning device comprising:
   a movable element having a natural elastic compression limit,
   a reversible piezoelectric actuator having a hard edge, said actuator placed in linear contact with and urged against said movable element along said hard edge, said actuator equipped with a first set of electrodes and a second set of electrodes, and
   a control unit for supplying electrical impulses to said first or said second sets of electrodes for causing periodic oscillations of said actuator in a first direction or a second direction respectively, said second direction being opposite to said first direction,
   whereby said oscillations in said first or said second direction by said actuator causing compressions of said movable element and its respective movement in the same direction, said compressions not exceeding said natural elastic compression limit, and cessation of said compressions causing said movable element to fully restore its initial shape.

2. The reversible piezoelectric positioning device as in claim 1, wherein said piezoelectric actuator positioned perpendicularly to said movable element.

3. The reversible piezoelectric positioning device as in claim 1, wherein said electrical impulses being supplied at a frequency close to a natural longitudinal resonance frequency of said actuator.

4. The reversible piezoelectric positioning device as in claim 1, wherein the hardness of said hard edge as characterized by a Young's modulus being between about $1 \times 10^7$ N/cm$^2$ and about $10 \times 10^7$ N/cm$^2$.

5. The reversible piezoelectric positioning device as in claim 4, wherein the hardness of said hard edge as characterized by a Young's modulus being about $5 \times 10^7$ N/cm$^2$.

6. The reversible piezoelectric positioning device as in claim 1, wherein said movable element further comprising an outer surface, the hardness of said outer surface as characterized by a Young's modulus being between about $0.5 \times 10^6$ N/cm$^2$ and about $5 \times 10^6$ N/cm$^2$.

7. The reversible piezoelectric positioning device as in claim 6, wherein the hardness of the outer surface of said movable element as characterized by a Young's modulus being about $2 \times 10^6$ N/cm$^2$.

8. The reversible piezoelectric positioning device as in claim 6, wherein during periodic compressions of the outer surface of said movable element by said actuator not exceeding said natural elastic compression limit, a relative deformation of the outer surface of said movable element not exceeding about 0.001.

9. A reversible piezoelectric positioning device of a rotary type comprising:
   a rotor of a cylindrical shape, said rotor having an outer surface, said rotor having a natural elastic compression limit,
   a reversible piezoelectric actuator having a hard edge, said actuator placed perpendicularly to, in linear contact with, and urged against said rotor by having said hard edge positioned along said outer surface of said rotor, said actuator containing a piezoelectric plate equipped with a first set of electrodes and a second set of electrodes, and
   a control unit for supplying electrical impulses to said first or said second sets of electrodes for causing periodic oscillations of said actuator in a first direction or a second direction respectively, said second direction being opposite to said first direction,
   whereby said oscillations in said first or said second direction by said actuator causing compressions of said rotor and its respective rotation in the same direction, said compressions not exceeding said natural elastic compression limit, and cessation of said compressions causing said outer surface of said rotor to fully restore its initial shape.

10. The reversible rotary piezoelectric positioning device as in claim 9, wherein the hardness of said hard edge as characterized by a Young's modulus being between about $1 \times 10^7$ N/cm$^2$ and about $10 \times 10^7$ N/cm$^2$.

11. The reversible rotary piezoelectric positioning device as in claim 10, wherein the hardness of said hard edge as characterized by a Young's modulus being about $5 \times 10^7$ N/cm$^2$.

12. The reversible rotary piezoelectric positioning device as in claim 9, wherein the hardness of said outer surface of said rotor as characterized by a Young's modulus being between about $0.5 \times 10^6$ N/cm$^2$ and about $5 \times 10^6$ N/cm$^2$.

13. The reversible rotary piezoelectric positioning device as in claim 12, wherein the hardness of the outer surface of said rotor as characterized by a Young's modulus being about $2 \times 10^6$ N/cm$^2$.

14. The reversible rotary piezoelectric positioning device as in claim 9, wherein during periodic compressions of the outer surface of said rotor by said actuator not exceeding said natural elastic compression limit, a relative deformation of the outer surface of said rotor not exceeding about 0.001.

15. A reversible piezoelectric positioning device of a linear type comprising:
   a slider having a linear insert, said insert having a natural elastic compression limit,
   a reversible piezoelectric actuator having a hard edge, said actuator placed perpendicularly to, in linear contact with, and urged against said slider by having said hard edge positioned along said insert of said slider, said actuator containing a piezoelectric plate equipped with a first set of electrodes and a second set of electrodes, and
   a control unit for supplying electrical impulses to said first or said second sets of electrodes for causing periodic oscillations of said actuator in a first direction or a second direction respectively, said second direction being opposite to said first direction,
   whereby said oscillations in said first or said second direction by said actuator causing compressions of said insert and its respective movement in the same direction, said compressions not exceeding said natural elastic compression limit, and cessation of said compressions causing said insert of said slider to fully restore its initial shape.

16. The reversible linear piezoelectric positioning device as in claim 15, wherein the hardness of said hard edge as characterized by a Young's modulus being between about $1 \times 10^7$ N/cm$^2$ and about $10 \times 10^7$ N/cm$^2$.

17. The reversible linear piezoelectric positioning device as in claim 16, wherein the hardness of said hard edge as characterized by a Young's modulus being about $5 \times 10^7$ N/cm$^2$.

18. The reversible linear piezoelectric positioning device as in claim 15, wherein the hardness of said insert of said slider as characterized by a Young's modulus being between about $0.5 \times 10^6$ N/cm$^2$ and about $5 \times 10^6$ N/cm$^2$.

19. The reversible linear piezoelectric positioning device as in claim 18, wherein the hardness of said insert of said slider as characterized by a Young's modulus being about $2 \times 10^6$ N/cm$^2$.

20. The reversible linear piezoelectric positioning device as in claim 15, wherein during periodic compressions of the insert of said slider by said actuator not exceeding said natural elastic compression limit, a relative deformation of the insert not exceeding about 0.001.

21. A disk drive device for recording and reading data from a disk, said device comprising:
   a housing,
   a disk retaining and rotating means,
   a movable arm having a first end, said arm rotatably attached to said housing at said first end, said arm having an outer arcuate surface with a natural elastic compression limit, said arcuate surface being opposite said first end,
   a readout head positioned along said arcuate surface of said arm, said readout head placed adjacent said disk,
   a reversible piezoelectric actuator having a hard edge, said actuator placed in linear contact with and urged against said arcuate surface of said arm along said hard edge, said actuator equipped with a first set of electrodes and a second set of electrodes, and
   a control unit for supplying electrical impulses to said first or said second sets of electrodes for causing periodic oscillations of said actuator in a first direction or a second direction respectively, said second direction being opposite to said first direction,
   whereby said oscillations in said first or said second direction by said actuator causing compressions of said arcuate surface of said arm and its respective movement in the same direction, said compressions not exceeding said natural elastic compression limit, and cessation of said compressions causing said arcuate surface of said arm to fully restore its initial shape.

22. The disk drive device as in claim 21, wherein the hardness of said hard edge as characterized by a Young's modulus being between about $1 \times 10^7$ N/cm$^2$ and about $10 \times 10^7$ N/cm$^2$.

23. The disk drive device as in claim 22, wherein the hardness of said hard edge as characterized by a Young's modulus being about $5 \times 10^7$ N/cm$^2$.

24. The disk drive device as in claim 21, wherein the hardness of said arcuate surface of said arm as characterized by a Young's modulus being between about $0.5 \times 10^6$ N/cm$^2$ and about $5 \times 10^6$ N/cm$^2$.

25. The disk drive device as in claim 24, wherein the hardness of said arcuate surface of said arm as characterized by a Young's modulus being about $2 \times 10^6$ N/cm$^2$.

26. The disk drive device as in claim 21, wherein during periodic compressions of the arcuate surface of said arm by said actuator not exceeding said natural elastic compression limit, a relative deformation of the arcuate surface not exceeding about 0.001.

27. The disk drive device as in claim 21, wherein the arm having a shape of a sector, said first end being about the center of said sector.

28. The disk drive device as in claim 27, wherein said arm having a cutout to reduce its weight.

29. The disk drive device as in claim 21, wherein said readout head further including a focusing lens positioned in the vicinity of said disk, said arm equipped with a bimorph plate and a set of plate electrodes, said bimorph plate having a first end and a suspended second end, said plate affixed to said arm at said first end, said lens placed on said plate at its suspended second end, whereby supplying electrical signals to said set of plate electrodes leading to a bending movement of said bimorph plate and respective movement of said lens closer or away from said disk.

30. The disk drive device for recording and reading data from a disk, said device comprising:
   a housing,
   a disk retaining and rotating means,
   a movable arm having a first end and a second end,
   an arm moving means containing a wheel for activating said moving means, said wheel having a natural elastic compression limit, said arm attached to said means at said second end,
   a readout head positioned at said first end of said arm, said readout head placed adjacent said disk,
   a reversible piezoelectric actuator having a hard edge, said actuator placed in linear contact with and urged against said wheel along said hard edge, said actuator equipped with a first set of electrodes and a second set of electrodes, and
   a control unit for supplying electrical impulses to said first or said second sets of electrodes for causing periodic oscillations of said actuator in a first direction or a second direction respectively, said second direction being opposite to said first direction,
   whereby said oscillations in said first or said second direction by said actuator causing compressions of said wheel and its respective rotation in the same direction, said compressions not exceeding said natural elastic compression limit, and cessation of said compressions causing said wheel to fully restore its initial shape.

31. The disk driving device as in claim 30, wherein said arm moving means further comprising:
   a shaft rotatably positioned at said housing, said shaft containing a screw type thread along at least a portion of its length, said wheel positioned on and attached to said shaft, and
   a mating gear engaged with said thread of said shaft, said second end of said arm attached to said mating gear,
   whereby reversible rotation of said wheel causing reciprocal motion of said mating gear and said arm.

32. A control method for a reversible piezoelectric positioning device, said device comprising a movable element having a natural elastic compression limit, a reversible piezoelectric actuator having a hard edge, said actuator placed in linear contact with and urged against said movable element along said hard edge, said actuator equipped with a first set of electrodes and a second set of electrodes, and a control unit for supplying electrical impulses to said first or said second sets of electrodes for causing periodic oscillations of said actuator and therefore compressions of said movable element, said compressions not exceeding said natural elastic compression limit, cessation of said compressions causing said movable element to fully restore its initial shape, said method comprising the steps of:
   supplying an electrical impulse having a first voltage from said control unit to said first set of electrodes for causing an oscillation of said actuator in a first direction and respective movement of said movable element in the same direction, supplying an electrical impulse having a second voltage from said control unit to said second set of electrodes for causing an oscillation of said actuator in a second direction and respective movement of said movable element in the same direction, said second direction being the opposite of said first direction, said second voltage being less than said first voltage, repeating the previous steps.

* * * * *